(12) United States Patent
Steele

(10) Patent No.: US 7,141,896 B2
(45) Date of Patent: Nov. 28, 2006

(54) PULSE WIDTH MODULATION SIGNAL GENERATOR

(75) Inventor: Andrew Steele, Sandbach (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/518,260

(22) PCT Filed: Jun. 13, 2003

(86) PCT No.: PCT/IB03/02862

§ 371 (c)(1),
(2), (4) Date: Dec. 16, 2004

(87) PCT Pub. No.: WO2004/004123

PCT Pub. Date: Jan. 8, 2004

(65) Prior Publication Data

US 2005/0236903 A1    Oct. 27, 2005

(30) Foreign Application Priority Data

Jun. 26, 2002 (GB) ................................ 0214728.8

(51) Int. Cl.
*H03K 3/011* (2006.01)
*H03K 3/017* (2006.01)
*H03K 7/08* (2006.01)

(52) U.S. Cl. ....................................... 307/108
(58) Field of Classification Search ................. 307/108
See application file for complete search history.

(56) References Cited

U.S. PATENT DOCUMENTS

| 4,404,481 A | 9/1983 | Ide et al. |
| 4,633,168 A | 12/1986 | Venema |
| 5,926,013 A * | 7/1999 | Brandt ........................ 323/370 |
| 5,982,160 A * | 11/1999 | Walters et al. ............... 323/282 |
| 6,798,180 B1 * | 9/2004 | Sase et al. ................... 323/282 |

FOREIGN PATENT DOCUMENTS

DE        10048593 A1     4/2002

* cited by examiner

Primary Examiner—Brian Sircus
Assistant Examiner—Hal I. Kaplan
(74) Attorney, Agent, or Firm—Peter Zawilski

(57) ABSTRACT

A signal generator has matched reference (4) and modulation (6) ramp circuits, each including current source (8, 32), capacitance (10) charged by the current source, voltage detector (18) and switch (24). The output of one of the voltage detectors (8) controls both switches (24), and the output of the other voltage detector (18) is used as the output.

10 Claims, 2 Drawing Sheets

PULSE WIDTH MODULATION SIGNAL GENERATOR

The invention relates to a signal generator, and in particular to a signal generator for producing a pulse width modulated (PWM) signal. The invention also relates to a switched dc—dc converter incorporating the signal generator and to a method of dc—dc conversion.

Pulse width modulation circuits are used in a variety of applications, including power devices. Temperature variation can be a real problem in such circuits, especially in the signal generation circuit that delivers a pulse width modulated output. Temperature variation can significantly effect the output making it difficult to achieve an accurate control of the on to off ratio in the PWM output. The on to off ratio is the ratio of time that the signal is on to the time that the signal is off.

Signal generators for producing pulse width modulated signals are particularly required for driving switching dc—dc voltage generators. Such circuits may be used in a number of fields where temperature variation can be a problem. A particular example of this is in the automotive sector.

Switching dc—dc circuits may be implemented synchronously, using a pull-up and a pull-down power transistor controlled by the output of a signal generator in such a fashion that only one of the two transistors is on at any one time. The common node between the pull-up and pull-down transistors is known as a drive node, and is connected to the output by means of a filter circuit. The on to off ratio controls the output voltage.

To use such a circuit in automotive applications to produce a dc voltage different from the input voltage requires that the circuit be rugged and in particular independent of supply voltage, process variation and temperature.

Existing designs do not achieve this to a satisfactory level. One example is DE-A-10048593 which discloses a switching circuit for the control of a number of components. No special arrangements for temperature stabilisation are provided.

There thus remains a need for an improved signal generation circuit and an improved switching voltage converter that provides improved accuracy particularly as temperature varies.

According to the invention there is provided a signal generator for generating a pulse width modulated control signal, comprising: matched reference and modulation ramp circuits, each including a current source, a capacitance arranged to be charged by the current output from the current source, a switch for discharging the capacitance, and a voltage detector for detecting a predetermined charge on the capacitance; wherein the output of the voltage detector of the reference ramp circuit is connected to control the switch of both the reference and the modulation ramp circuits; and the output of the voltage detector of the modulation ramp circuit is connected to an output.

The invention uses the properties of the matched reference and modulation ramp circuits to achieve a high degree of independence from supply voltage, process variation and temperature. Any change in the current source, the capacitor or the voltage level detected in the voltage detector in one of the ramp circuits will in general be matched in the other and cancelled out, thereby leading to no change in the output percentage on to off ratio. Thus, the signal generator is highly suitable for use with power integrated circuits which may operate at high temperature and with uneven supply voltage.

A further advantage of the circuit is that it is open loop and does not need an op-amp in it. This offers a number of advantages. It greatly simplifies the design and operation of the circuit as the performance of the circuit is not limited by the performance of the op-amp. This means that op-amp offset and slew rates which could reduce the performance of existing circuits do not need to be considered. For switching voltage applications, a high frequency is beneficial and so for a good level of accuracy the slew rate on the output needs to be very high. Thus, providing a suitable op-amp is difficult, a difficulty solved in the present invention which does not require an op-amp.

The other advantage of an open loop system is that the method of charging a capacitance by current sources effectively integrates the input and reference current over the period of the pulse width modulated signal. This means that the system is less sensitive to noise on both the input and the reference currents. This gives improved accuracy over existing designs.

The current source of the reference ramp circuit is preferably a fixed current constant current source and the current source of the modulation ramp circuit is preferably a modulated current source having a control input for controlling the output current and hence for controlling the percentage of time the output is on.

If the signal input on the control input is continuously variable the final pulse width modulated output will effectively integrate the input for the whole period, rather than just sample the input voltage at a given moment. Therefore, the signal generator according to the invention will give a better representation of the changing input signal in its control of the output path width modulation pulse stream than an existing design would. This gives the dual charge rate circuit considerable advantages over conventional designs in systems with dynamic inputs.

In embodiments of the invention, in each of the measurement and modulation ramp circuits the current source is connected to the capacitance at a measurement node; the voltage detector has a sense input and a control output with the sense input being connected to the measurement node, for detecting the voltage on the measurement node and outputting a control signal on the control output under predetermined conditions; the switch is arranged across the capacitance; and the switch has a control input, the switch being arranged to be closed by a signal on the control input for discharging the capacitance in response to the signal; the capacitance, voltage detector and switch of the reference and modulation ramp circuits are matched, and the control output of the voltage detector on the measurement node is connected to the control input of the switches of both the reference and modulation ramp circuits.

The switch in each ramp circuit is preferably a transistor having controlled terminals (source and drain) connected across the capacitance and a control terminal (gate) connected to the output of the voltage detector of the reference ramp circuit. The transistor can then simply be switched on to discharge the capacitance through the transistor.

The modulation and reference ramp circuits are preferably integrated on a single semiconductor substrate to ensure good temperature matching and corresponding benefit to the self-cancelling properties of the circuit.

The signal generator may be included in a switching dc—dc converter circuit having a dc input, a dc output, and a switching module connected between the dc input and the dc output and containing at least one switch controlled by the output of the signal generator.

The invention also relates to a power switching device having high and low dc inputs; a filter circuit connected between a drive node and the low voltage dc input, the filter circuit having a filter output; at least one of a first power transistor connected between the high dc input and the drive node and a second power transistor connected between the drive node and a low voltage node; and a signal generator as above connected to drive the at least one of the first and second power transistors for producing a predetermined dc output voltage between the filter output and the low voltage node.

Preferably, the signal generator and at least one power transistor are included in the same device package.

The first and second power transistors may preferably be power MOSFETs.

The invention also relates to a method of generating a control signal for a pulse width modulator, including: providing matched reference and modulation ramp circuits; each of the first and second ramp circuits including each including a current source, a capacitance arranged to be charged by the current output from the current source; a switch for discharging the capacitance, and a voltage detector for detecting a predetermined charge on the capacitance; driving a constant current to charge the capacitance of the reference ramp circuit; supplying a modulated constant current to the measurement node of the modulation ramp circuit; detecting in the voltage detector in each ramp circuit when the voltage across the respective capacitance exceeds a predetermined value; outputting a control signal from the voltage detector in the reference ramp circuit to the inputs of the switches in both modulation and reference ramp circuits to discharge the capacitance when the voltage across the capacitance in the reference ramp circuit exceeds the predetermined value; and outputting the signal from the voltage detector in the modulation ramp circuit as the control signal for a pulse width modulator.

Embodiments of the invention will now be described, purely by way of example, with reference to the accompanying drawings in which.

Figure 1:
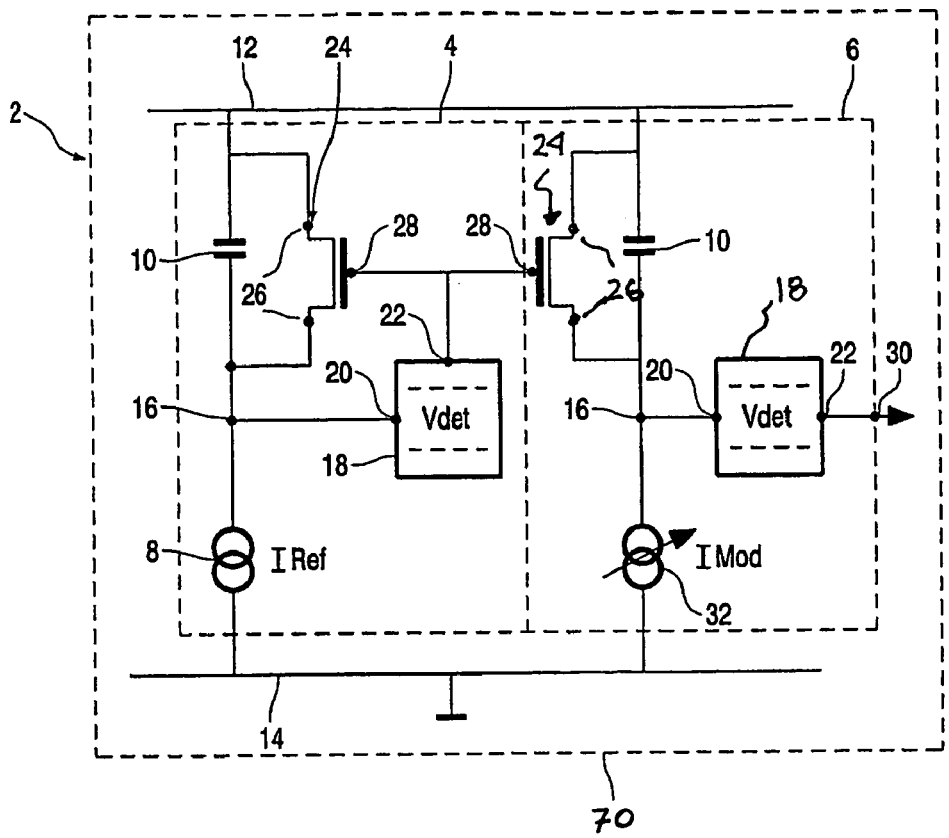
FIG. 1 shows a signal generator according to the invention.

Referring to FIG. 1, signal generator 2 formed on a single semiconductor substrate 70 includes matching reference 4 and modulation 6 ramp circuits. Each circuit includes a current source 8, 32 and a capacitor 10 connected in series between high 12 and low 14 voltage rails. The node between the current source 8 and capacitor 10 will be referred to as the measurement node, and it is connected to voltage detector 18 which has input 20 connected to the measurement node. The voltage detector further includes output 22. Transistor 24 is connected across the capacitor 10. The transistor 24 is in the embodiment a MOSFET having controlled terminals 26 (the source and drain) connected to opposite ends of the capacitor and a control terminal 28 (the gate) which is connected in both reference and modulation ramp circuits 4, 6 to the output 22 of the voltage detector 18 in the reference ramp circuit. The output of the voltage detector in the modulation ramp circuit is connected to output node 30 to form the output of the signal generator.

Each of the voltage detector circuits 18 is arranged to detect the same predetermined voltage on the respective measurement node 16 and output a signal on output 22 suitable for switching on the transistors 24 which act as switches to discharge the capacitor.

The current source 32 in the modulation ramp circuit is adjustable to allow the output on:off ratio of the output pulse width modulation (PWM) signal to be adjusted.

The initial cycle of the circuit is as follows at the start of the cycle. The capacitor 10 is reset via the transistor 24 so that both sides of the capacitor 10 are at the same potential. The capacitor 10 is then charged from the current source 8 with the transistor 24 acting as an open switch. The capacitor 10 will continue to charge until the voltage detector 18 detects a predetermined voltage on measurement node 16. At this time, the voltage detector outputs a signal on output 22 suitable to switch on the transistor 24 to short both sides of the capacitor together to discharge the capacitor 10. The discharge of the capacitor 10 in both reference 4 and modulation 6 ramp circuits is controlled by the voltage detector 18 in the reference ramp circuit.

The charge rate of the capacitor 10 in the modulation ramp circuit 6 is controlled by current source 32. As the circuits are matched if the current output by current source 32 in the modulation ramp circuit is greater than the current output by current source 8 in the reference ramp circuit then the modulation detector 18 in the modulation ramp circuit will trigger to produce an output before the voltage detector 18 in the reference ramp circuit. When the reference voltage detector triggers it discharges the capacitor 10 in the modulation ramp circuit and accordingly resets the voltage detector 18 in the modulation ramp circuit and returns the sign of the output to its original sign.

Figure 2:
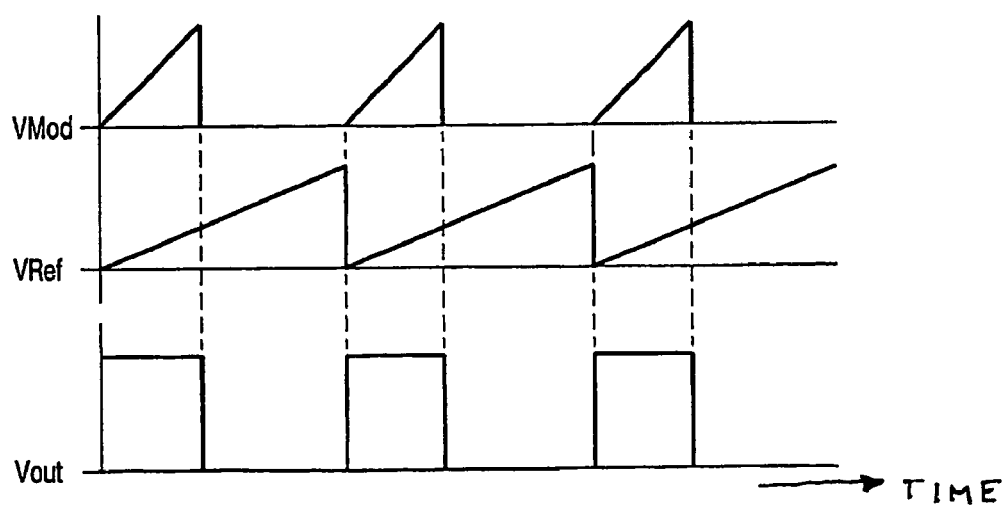
FIG. 2 shows outputs of the voltage modulation and voltage reference circuits.

The output of the modulation ramp circuit 18 functions as the output of the signal generator. The pulse rate modulation, as a percentage, is a ratio of the reference current source 8 to the current output by the modulation current source 32. Thus, if both currents are equal, 100% of pulse width modulation signal will be output. Similarly, if the modulation current source 32 produces twice as much current as the reference current source 8, then 50% of pulse width modulation will be achieved. An illustrative example is shown FIG. 2 for a 2.5 times ratio producing a 40% on output.

Traditional PWM circuits generate the PWM signal by generating a regular reference waveform, usually a sawtooth, and comparing it against a dc voltage with an op-amp. By changing the level of the dc voltage the PWM percentage can be changed. The problem with this approach is that the dc voltage has to carefully match the regular waveform as the two circuits that control these two signals are completely independent. This means that any variation in component values in either circuit can cause errors in the PWM output. To rectify this there is usually a degree of trimming in these types of circuits. The dual charge technique according to the invention is not affected by these problems, because the two circuits that make up the system are the same and are self cancelling. This means that as long as the variation in components is common to the two circuits then a high degree of matching can be obtained, because exactly the same components are used in both. Therefore both halves of the circuit will be affected in the same way and the variation will cancel out. This makes the circuit ideally suited for IC applications where components exhibit good matching.

The self cancelling design of the circuit also means that it has a high degree of temperature independence. Any change in the current source, the capacitor or the voltage level detected in the voltage detector, due to a change in a component's characteristics, will be matched in the other circuit and cancelled out, even if the temperature rapidly changes. Therefore the PWM on-ratio will stay more constant compared with existing circuits. This is highly important in power IC's, which have a wide operating temperature range.

A further advantage of this circuit is that it is open loop and as such does not require an op-amp in its design. This offers a number of advantages. Firstly it greatly simplifies the design and operation of the circuit as the performance of the PWM circuit is not limited by the performance of the op-amp. This means that offsets and slew rates which could reduce the performance of an existing PWM design do not have to be considered. This is especially important in this case, where the PWM system has a very high frequency and to get a good level of accuracy the slew rate on the output will have to be very high, which can make designing a suitable op-amp difficult.

Another advantage of this system is that the method effectively integrates the input and reference currents over the period of the PWM signal, by charging the capacitors in the circuit at the rate of the input current. This means that the system is less sensitive to noise on both the input and the reference currents. This gives improved accuracy over existing designs. More importantly, it mean that if the input is continually varying the final PWM output will be determined by the input level for the whole period, rather than just sampled the voltage at the moment the input was equal to the reference waveform. Therefore the dual charge circuit will give a better representation of the changing input signal in its control of the output PWM pulse stream, than an existing design would. This gives the dual charge rate circuit considerable advantages over conventional designs, in systems that have dynamic inputs.

Figure 3:
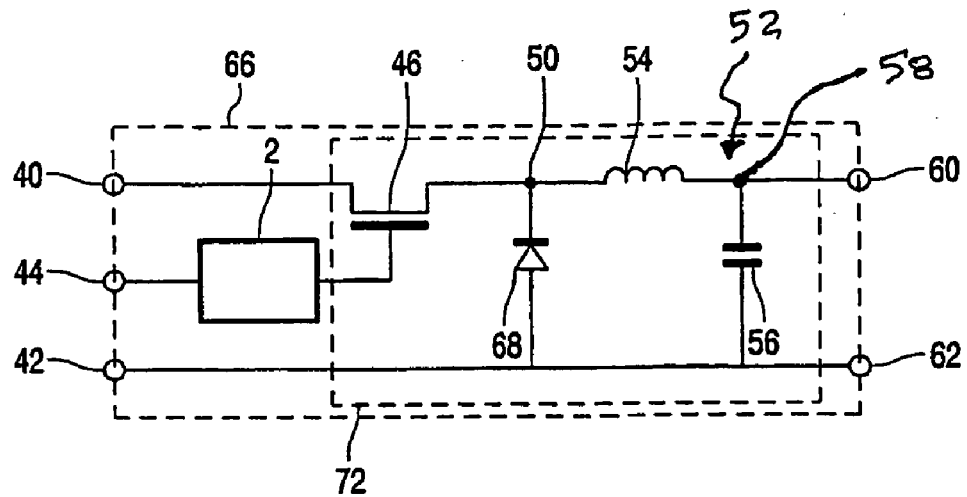
FIG. 3 shows a first embodiment of a switching modulator incorporating the signal generator of FIG. 1.

Referring to FIG. 3, the signal generator 2 may be used to drive the transistor of a switching dc—dc converter. The input dc signal is provided on high 40 and low 42 input dc terminals. Control terminal 44 also feeds into signal generator 2 to control the required output voltage.

The signal generator is connected to switching circuit 72 to control MOSFET switch 46 which is connected between high voltage input 40 and drive node 50. A filter 52 is connected between drive node 50 and low voltage terminal 42, the filter 52 in this case being formed by inductor 54 and capacitor 56 connected in series with filter node 58 between the two. A diode 68 provides a current path to the inductor 54 when the switch 46 is off.

Low voltage output terminal 62 is connected to low voltage input terminal 42, and high voltage output terminal 60 is connected to the filter node 58. The components may all be integrally formed in a single device package 66.

The output may be used, for example, to drive a lamp in an automotive application.

Figure 4:
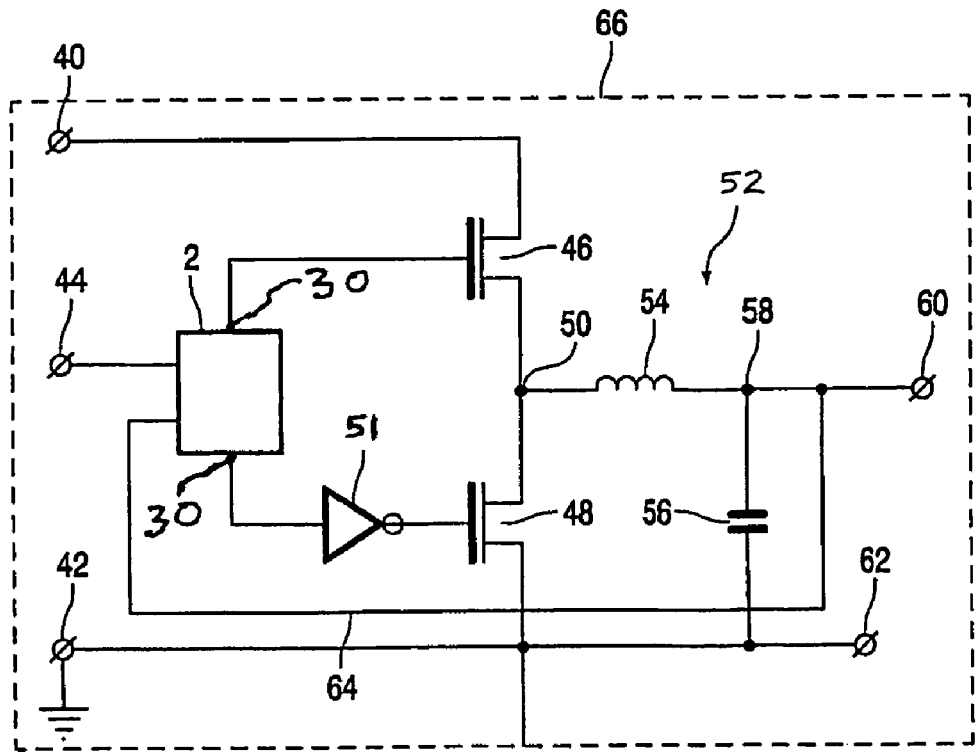
FIG. 4 shows a second embodiment of switching modulator incorporating the signal generator of FIG. 1.

Referring to FIG. 4, an alternative embodiment includes a synchronous dc—dc converter having two transistors.

The output 30 from the signal generator 2 is connected to first 46 and second 48 power transistors, in this case MOSFETs. One of the transistors is driven directly from output node 30, whereas the other transistor is driven through inverter 51. The transistors 46, 48 are connected in series between the input high 40 and low 42 dc voltage terminals. The node joining the two transistors is known as the drive node since the output drive is taken from this point.

A filter 52 is connected between drive node 50 and low voltage terminal 42, the filter 52 in this case being formed by inductor 54 and capacitor 56 connected in series with filter node 58 between the inductor 54 and the capacitor 56.

High 60 and low 62 output voltage terminals are connected to filter node 58 and to low voltage input node 42 respectively. Feedback link 64 is used to feed back to control the current output from the modulation current source. The details of how the modulation current signal is controlled from the signal on the feedback link 64 and the input control node 44 are well known to the person skilled in the art and so will not be described further.

Package 66, indicated by a dotted line, includes the whole circuit, including power transistors 46, 48 and signal generator 2. In alternative embodiments, the package 66 may include one of the transistors 46, 48, leaving the other to be supplied as a discrete component, or the signal generator 2 may be separately packaged. Providing the two halves of the signal generator 2 on the same chip and in the same package assists in temperature matching.

The transistors 46, 48 form a switching module. It should be noted that the invention is also applicable to other types of switching module, such as those using only a single transistor. Further, the skilled person will be aware of many alternative filter designs that may be used to replace the filter 52 of the described embodiment.

The signal generator and switching converter according to the invention is particularly suited for applications in which temperature may vary, such as automotive applications.

In particular, the signal generator 2 may be included as the drive for an integrated power device such as the TOPFET (Trade Mark) marketed by Philips.

From reading the present disclosure, other variations and modifications will be apparent to persons skilled in the art. Such variations and modifications may involve equivalent and other features which are already known in the design, manufacture and use of a signal generator and/or pulse width modulation circuit and which may be used in addition to or instead of features described herein. Although claims have been formulated in this application to particular combinations of features, it should be understood that the scope of disclosure also includes any novel feature or any novel combination of features disclosed herein either explicitly or implicitly or any generalization thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A signal generator (2) for generating a pulse width modulated signal, comprising: matched reference (4) and modulation (6) ramp circuits, each including a current source (8, 32), a capacitance (10) arranged to be charged by the current output from the current source (8, 32), a switch (24) for discharging the capacitance, and a voltage detector (18) for detecting a predetermined charge on the capacitance; wherein the output (22) of the voltage detector (18) of the reference ramp circuit (4) controls the switch (24) of both the reference (4) and the modulation ramp circuits (6), wherein the current source of the reference ramp circuit is a fixed current constant current source and the current source of the modulation ramp circuit is a modulated current source having a control input for controlling an output constant current, and in turn for controlling a percentage of time the output current is on; and the output (32) of the voltage detector (18) of the modulation ramp circuit (6) is connected to an output (30) for providing the pulse width modulated signal.

2. A signal generator according to claim 1, wherein in each of the measurement and modulation ramp circuits the current source (8, 32) is connected to the capacitance (10) at a measurement node (16); the voltage detector (18) has a sense input (20) and an output (22) with the sense input (20) being connected to the measurement node (16), for detecting the voltage on the measurement node (16) and outputting a control signal on the output (22) under predetermined conditions; the switch (24) is arranged across the capacitance (10); and the switch (24) has a control input (28), the switch being arranged to be closed by a signal on the control input (28) for discharging the capacitance in response to the control signal; the capacitance (10), voltage detector (18) and switch (24) of the reference (4) and modulation (6) ramp circuits are matched; and the control output (22) of the voltage detector (18) on the reference ramp circuit (4) is connected to the control input (28) of the switches (24) of both the reference (4) and modulation (6) ramp circuits.

3. A signal generator according to claim 1 wherein the switch (24) in each ramp circuit is a transistor having controlled terminals (26) connected across the capacitance and the control terminal (28) connected to the output of the voltage detector of the reference ramp circuit.

4. A signal generator according to claim 1 wherein the modulation (6) and reference (4) ramp circuits are integrated on a single semiconductor substrate (70).

5. A switching dc—dc converter circuit comprising:
a dc input;
a dc output;
a signal generator for generating a pulse width modulated signal, comprising:
   matched reference and modulation ramp circuits, each including a current source,
   wherein the current source for the modulation ramp circuit is adjustable and the current source for the reference ramp circuit is constant, a capacitance arranged to be charged by the current output from the current source, a switch for discharging the capacitance, and a voltage detector for detecting a predetermined charge on the capacitance; wherein the output of the voltage detector of the reference ramp circuit controls the switch of both the reference and the modulation ramp circuits;
   and the output of the voltage detector of the modulation ramp circuit is connected to an output for providing the pulse width modulated signal; and
   a switching module connected between the dc input and the dc output and containing at least one switch controlled by the output of the voltage detector of the modulation ramp circuit of the signal generator to convert an input dc voltage into an output dc voltage.

6. A power switching device according to claim 5 further comprising a device package (66) including the signal generator (2) and at least one power transistor switch (46).

7. A power switching device according to claim 5 comprising first (46) and second (48) power transistors wherein the signal generator (2) is arranged to switch on the first power transistor (46) only when the second transistor (48) is switched off and to switch on the second transistor (48) only when the first transistor (46) is switched off.

8. A method of generating a control signal for a pulse width modulator, including: providing matched reference (4) and modulation (6) ramp circuits; each of the first and second ramp circuits (4, 6) including a current source (8, 32), a capacitance (10) arranged to be charged by the current output from the current source; a switch (24) for discharging the capacitance, and a voltage detector (18) for detecting a predetermined charge on the capacitance; driving a constant current to charge the capacitance (10) of the reference ramp circuit; supplying a modulated current to charge the capacitance (10) of the modulation ramp circuit (6); detecting in the voltage detector (18) in each ramp circuit (4, 6) when the voltage across the respective capacitance (10) exceeds a predetermined value; outputting a control signal from the voltage detector (18) in the reference ramp circuit (4) to the inputs of the switches (24) in both modulation and reference ramp circuits (4, 6) to discharge the capacitance (10) when the voltage across the capacitance in the reference ramp circuit exceeds the predetermined value; and outputting the signal from the voltage detector (18) in the modulation ramp circuit (6) as the control signal for a pulse width modulator.

9. A method according to claim 8 further including adjusting the modulated constant current to vary the percentage of time the output is on.

10. A method according to claim 8, wherein the current source for the modulation ramp circuit is adjustable and the current source for the reference ramp circuit is constant.

* * * * *